US012593453B2

(12) United States Patent
Lee et al.

(10) Patent No.: US 12,593,453 B2
(45) Date of Patent: Mar. 31, 2026

(54) FERROELECTRIC MEMORY DEVICE

(71) Applicant: SAMSUNG ELECTRONICS CO., LTD., Suwon-si (KR)

(72) Inventors: Kiheun Lee, Suwon-si (KR); Yongseok Kim, Suwon-si (KR); Hyuncheol Kim, Suwon-si (KR); Daewon Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 379 days.

(21) Appl. No.: 18/208,943

(22) Filed: Jun. 13, 2023

(65) Prior Publication Data

US 2024/0049472 A1     Feb. 8, 2024

(30) Foreign Application Priority Data

Aug. 5, 2022     (KR) ........................ 10-2022-0098126

(51) Int. Cl.
| | |
|---|---|
| *H10B 51/20* | (2023.01) |
| *H10B 51/10* | (2023.01) |
| *H10D 30/69* | (2025.01) |
| *H10D 62/84* | (2025.01) |
| *H10D 64/68* | (2025.01) |

(52) U.S. Cl.
CPC ............. *H10B 51/20* (2023.02); *H10B 51/10* (2023.02); *H10D 30/701* (2025.01); *H10D 62/84* (2025.01); *H10D 64/689* (2025.01)

(58) Field of Classification Search
CPC ...... H10B 51/10; H10B 51/20; H10D 30/701; H10D 62/94; H10D 64/689
See application file for complete search history.

(56) References Cited

U.S. PATENT DOCUMENTS

| | | | |
|---|---|---|---|
| 10,192,972 B2 | 1/2019 | Sakai et al. | |
| 10,510,862 B2 | 12/2019 | Ino et al. | |
| 10,593,699 B2 | 3/2020 | Yoo | |
| 10,600,808 B2 | 3/2020 | Schröder | |
| 10,833,102 B2 | 11/2020 | Teo et al. | |
| 10,998,408 B2 | 5/2021 | Yamaguchi | |
| 11,043,591 B2 | 6/2021 | Gros-Jean et al. | |
| 11,139,397 B2 | 10/2021 | Lin et al. | |
| 11,152,508 B2 | 10/2021 | Chui et al. | |
| 11,251,036 B2 | 2/2022 | Salahuddin et al. | |
| 11,296,098 B2 | 4/2022 | Lee et al. | |
| 2019/0386142 A1* | 12/2019 | Gros-Jean .............. | H10B 51/30 |

(Continued)

FOREIGN PATENT DOCUMENTS

| | | | | | |
|---|---|---|---|---|---|
| CN | 108511517 A | * | 9/2018 | ....... | H01L 21/02181 |
| KR | 10-2028600 B1 | | 10/2019 | | |
| WO | WO-2017171851 A1 | * | 10/2017 | ........... | H10D 30/701 |

OTHER PUBLICATIONS

Sharma et al., 2020 IEEE International Electron Devices Meeting (IEDM), 391-394 (2020).

*Primary Examiner* — Matthew E Warren
(74) *Attorney, Agent, or Firm* — Muir Patent Law, PLLC

(57) ABSTRACT

A ferroelectric memory device includes a channel layer, a gate insulation layer on the channel layer, and a gate electrode layer on the gate insulation layer. The gate insulation layer includes a ferroelectric inductive layer and a ferroelectric stack structure on the ferroelectric inductive layer, and the ferroelectric stack structure is stacked in an order or reverse order of a ferroelectric layer and a non-ferroelectric layer.

20 Claims, 19 Drawing Sheets

FETR 1

(56)　　　　　　　References Cited

U.S. PATENT DOCUMENTS

| | | | |
|---|---|---|---|
| 2020/0105897 A1* | 4/2020 | Hsu ................... | H01L 21/02194 |
| 2020/0211839 A1* | 7/2020 | Salahuddin .......... | H10D 64/667 |
| 2021/0043654 A1* | 2/2021 | Yoo ........................ | H10B 51/00 |
| 2021/0091227 A1* | 3/2021 | Heo ..................... | H10D 64/033 |
| 2021/0241947 A1 | 8/2021 | Jonker et al. | |
| 2021/0305399 A1 | 9/2021 | Heo et al. | |
| 2021/0359101 A1 | 11/2021 | Heo et al. | |
| 2021/0366932 A1* | 11/2021 | Lee ........................ | H10B 51/00 |

* cited by examiner

FETR 1

FETR 1

FETR 1

$18a_2$
$18a_1$ $\Big\}18bl1$

Z

X

FETR 2

16-2br
16-2ar
15
12

FETR 3

FETR 3

FETR 4

FERROELECTRIC MEMORY DEVICE

CROSS-REFERENCE TO RELATED APPLICATION

This application is based on and claims priority under 35 U.S.C. § 119 to Korean Patent Application No. 10-2022-0098126, filed on Aug. 5, 2022, in the Korean Intellectual Property Office, the disclosure of which is incorporated by reference herein in its entirety.

BACKGROUND

1. Field

Embodiments relate to a memory device, and more particularly, to a ferroelectric memory device.

2. Description of the Related Art

Ferroelectric materials or ferroelectrics are materials having ferroelectricity, and maintain self-polarization as internal electric dipole moments are aligned even when an electric field is applied thereto from the outside. In ferroelectric materials, when an external electric field is applied thereto, electric polarization may exhibit a hysteresis characteristic. Ferroelectric materials are materials where remanent polarization is semi-permanently maintained therein even when a voltage is again shifted to 0 V after a certain voltage is applied thereto.

Ferroelectric memory devices, in which a ferroelectric material is applied as a gate insulation layer (or a gate dielectric layer), are being researched. In ferroelectric memory devices, a maximum range of a working voltage, which is applied thereto so that remanent polarizations differentiated from one another are recorded in a gate insulation layer including a ferroelectric layer, is defined as a memory window.

SUMMARY

According to embodiments, there is provided a ferroelectric memory device including a channel layer, a gate insulation layer formed on the channel layer, and a gate electrode layer formed on the gate insulation layer. The gate insulation layer includes a ferroelectric inductive layer and a ferroelectric stack structure formed on the ferroelectric inductive layer, the ferroelectric stack structure being stacked in an order or reverse order of a ferroelectric layer and a non-ferroelectric layer.

According to embodiments, there is provided a ferroelectric memory device including a channel layer, a gate insulation layer formed on the channel layer, and a gate electrode layer formed on the gate insulation layer. The gate insulation layer includes a ferroelectric inductive layer and a ferroelectric stack structure formed on the ferroelectric inductive layer, and the ferroelectric stack structure is stacked in an order or reverse order of a ferroelectric layer and a non-ferroelectric layer and includes a two-dimensional transition metal dichalcogenide layer.

According to embodiments, there is provided a ferroelectric memory device including a channel layer, a gate insulation layer formed on the channel layer, and a gate electrode layer formed on the gate insulation layer, wherein the gate insulation layer includes a ferroelectric inductive layer and a ferroelectric stack structure formed on the ferroelectric inductive layer, the ferroelectric stack structure being stacked in an order or reverse order of a non-ferroelectric layer and a ferroelectric layer, and the ferroelectric layer includes hafnium oxide, zirconium oxide, hafnium zirconium oxide, or a combination material thereof.

BRIEF DESCRIPTION OF THE DRAWINGS

Features will become apparent to those of skill in the art by describing in detail exemplary embodiments with reference to the attached drawings, in which.

DETAILED DESCRIPTION

Herein, a singular form of elements may include a plural form unless another case is clearly designated in context. The drawings for more clearly describing embodiments may be exaggerated.

Figure 1:
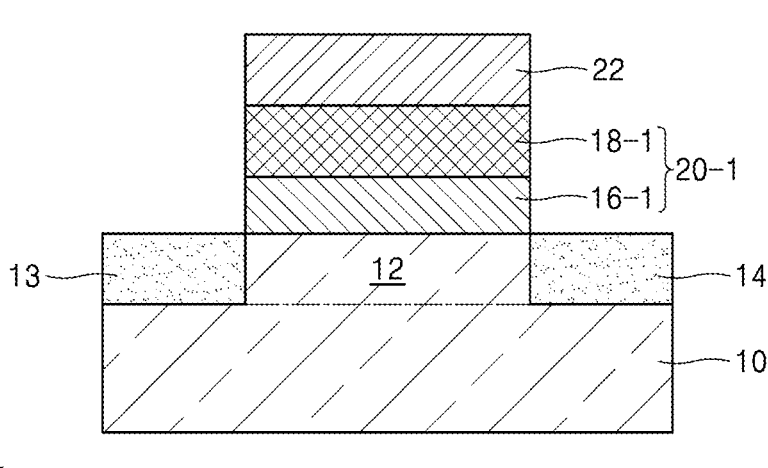
FIG. 1 is a cross-sectional view of a ferroelectric memory device according to an embodiment.
Figure 1:
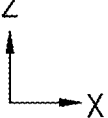

FIG. 1 is a cross-sectional view illustrating a ferroelectric memory device FETR1 according to an embodiment.

Referring to FIG. 1, the ferroelectric memory device FETR1 may include a semiconductor substrate 10 with a channel layer 12, a source 13, and a drain 14. In FIG. 1, an X direction may be a direction parallel with the semiconductor substrate 10, and a Z direction may be a direction vertical to the semiconductor substrate 10. The ferroelectric memory device FETR1 may be referred to as a ferroelectric field effect transistor.

In some embodiments, the semiconductor substrate 10 may include silicon (Si), e.g., crystalline Si, polycrystalline Si, or amorphous Si. In some embodiments, the semiconductor substrate 10 may include a semiconductor element, e.g., germanium (Ge), or may include at least one compound semiconductor, e.g., one of silicon germanium (SiGe), silicon carbide (SiC), gallium arsenide (GaAs), indium arsenide (InAs), and indium phosphide (InP). In some embodiments, the semiconductor substrate 10 may include a silicon-on-insulator (SOI) or a germanium-on-insulator (GOI) substrate. The semiconductor substrate 10 may include a conductive region (e.g., an impurity-doped well or an impurity-doped structure).

In the semiconductor substrate 10, the channel layer 12 may be formed between the source 13 and the drain 14. In some embodiments, the channel layer 12 may include the same material as that of the semiconductor substrate 10. In some embodiments, the channel layer 12 may include a semiconductor material, e.g., Si, Ge, SiGe, or Group III-V elements. The source 13 and the drain 14 may be disposed apart from each other at both sides of the channel layer 12.

The source 13 and the drain 14 may be impurity regions doped with impurities of the semiconductor substrate 10. In some embodiments, the source 13 and the drain 14 may have a conductivity type which differs from that of the semiconductor substrate 10. For example, when the semiconductor substrate 10 has p-type conductivity, the source 13 and the drain 14 may have n-type conductivity. In some embodiments, the source 13 and the drain 14 may respectively be a first conductive line (or a first conductive region) and a second conductive line (or a second conductive region).

The ferroelectric memory device FETR1 may include a gate insulation layer 20-1 and a gate electrode layer 22. The gate insulation layer 20-1 may be a gate dielectric layer. The gate insulation layer 20-1 may be formed, e.g., directly, on the channel layer 12.

The gate insulation layer 20-1 may include an insulation material having a hysteresis characteristic. The gate insulation layer 20-1 may include a ferroelectric inductive layer 16-1 and a ferroelectric stack structure 18-1. A structure of the gate insulation layer 20-1 will be described below in detail.

The gate electrode layer 22 may be formed on the gate insulation layer 20-1. The gate electrode layer 22 may include a metal material or conductive metal nitride. For example, the gate electrode layer 22 may include tungsten, aluminum, copper, titanium, tantalum, titanium nitride, tantalum nitride, tungsten nitride, tungsten carbide nitride, or a combination thereof. In some embodiments, the gate electrode layer 22 may be a third conductive line. Therefore, the ferroelectric memory device FETR1 may include three conductive lines (or three conductive terminals).

Figure 2A:
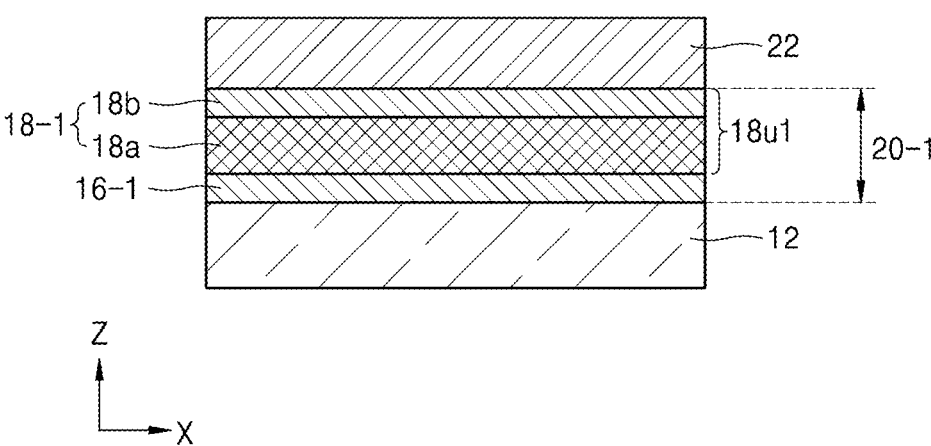
FIGS. 2A and 2B are cross-sectional views of a gate insulation layer of FIG. 1.
Figure 2B:
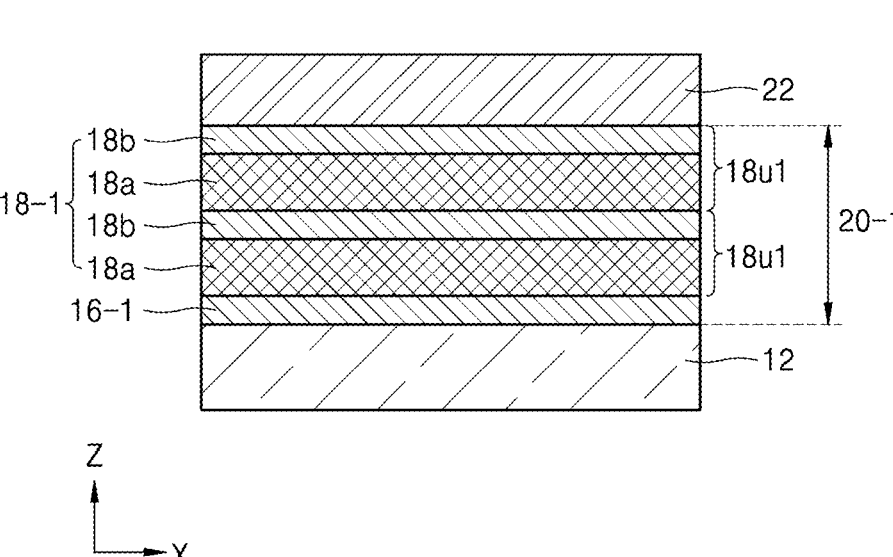

FIGS. 2A and 2B are cross-sectional views for describing a configuration of the gate insulation layer 20-1 of FIG. 1.

In detail, the gate insulation layer 20-1 may include the ferroelectric inductive layer 16-1 and the ferroelectric stack structure 18-1. The ferroelectric inductive layer 16-1 may include a two-dimensional (2D) material and may include nitride having a hexagonal crystal structure. The ferroelectric inductive layer 16-1 may include boron nitride (BN).

The nitride (e.g., the boron nitride) included in the ferroelectric inductive layer 16-1 may not chemically have a dangling bond, and thus, may be low in reactivity with oxygen. Therefore, oxide may not penetrate into an interface between the channel layer 12 and the ferroelectric inductive layer 16-1 in a process of manufacturing the ferroelectric memory device FETR1. An interface layer including oxide may not be formed between the channel layer 12 and the ferroelectric inductive layer 16-1. Therefore, the ferroelectric memory device FETR1 may increase endurance and a memory window.

The ferroelectric stack structure 18-1 may include a ferroelectric layer 18a and a non-ferroelectric layer 18b. The ferroelectric layer 18a may have a thickness, e.g., in the Z direction, which is greater than the ferroelectric inductive layer 16-1 and the non-ferroelectric layer 18b. The ferroelectric layer 18a, the ferroelectric inductive layer 16-1, and the non-ferroelectric layer 18b may have a thickness of several nm to tens nm.

The ferroelectric layer 18a may include a 2D transition metal dichalcogenide layer. The 2D transition metal dichalcogenide layer configuring the ferroelectric layer 18a may be configured as an $MX_2$ layer having a 3R-type rhombohedral crystal structure. Here, M may include one or more of molybdenum (Mo), tungsten (W), and zirconium (Zr), and X may include one or more of sulfur (S), selenium (Se), and tellurium (Te). The $MX_2$ layer having a rhombohedral crystal structure will be described below in detail.

The 2D transition metal dichalcogenide layer configuring the ferroelectric layer 18a may have a ferroelectric characteristic. The 2D transition metal dichalcogenide layer configuring the ferroelectric layer 18a may have a hysteresis characteristic, based on the application of an electric field. A polarization direction of the 2D transition metal dichalcogenide layer configuring the ferroelectric layer 18a may be switched based on the application of an electric field.

The non-ferroelectric layer 18b may include a 2D material and may include nitride having the hexagonal crystal structure. The non-ferroelectric layer 18b may include BN. The non-ferroelectric layer 18b may include the same material as that of the ferroelectric inductive layer 16-1.

The ferroelectric stack structure 18-1, as illustrated in FIG. 2A, may include a unit ferroelectric stack structure 18u1 stacked in the order of the ferroelectric layer 18a and the non-ferroelectric layer 18b, e.g., the ferroelectric layer 18a may be between the ferroelectric inductive layer 16-1 and the non-ferroelectric layer 18b. The unit ferroelectric stack structure 18u1 may be stacked in plurality. For example, as illustrated in FIG. 2B, the ferroelectric stack structure 18-1 may include two unit ferroelectric stack structures 18u1, e.g., so the ferroelectric layer 18a and the non-ferroelectric layer 18b may alternate on the ferroelectric inductive layer 16-1.

The gate insulation layer 20-1 of the ferroelectric memory device FETR1 may include a 2D-material ferroelectric inductive layer 16-1, a 2D-material ferroelectric layer 18a, and a 2D-material non-ferroelectric layer 18b. The gate insulation layer 20-1 may be atomically adjusted in atomic direction by using a 2D material and may be formed to have a thin thickness.

Particularly, the gate insulation layer 20-1 may include a plurality of unit ferroelectric stack structures 18u1, including the 2D-material ferroelectric layer 18a and the 2D-material non-ferroelectric layer 18b, on the ferroelectric inductive layer 16-1. Accordingly, the ferroelectric memory device FETR1 may enhance remanent polarization (e.g., polarization remaining after removal of a magnetic field) and may increase a memory window.

Figure 3A:
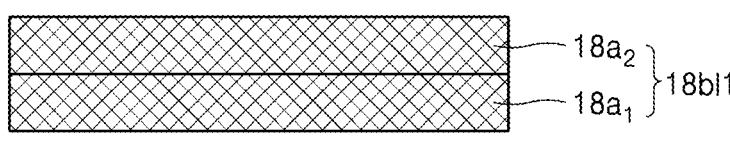
FIGS. 3A and 3B are diagrams of a ferroelectric material of FIGS. 2A and 2B.
Figure 3A:
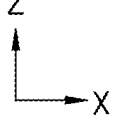
Figure 3B:
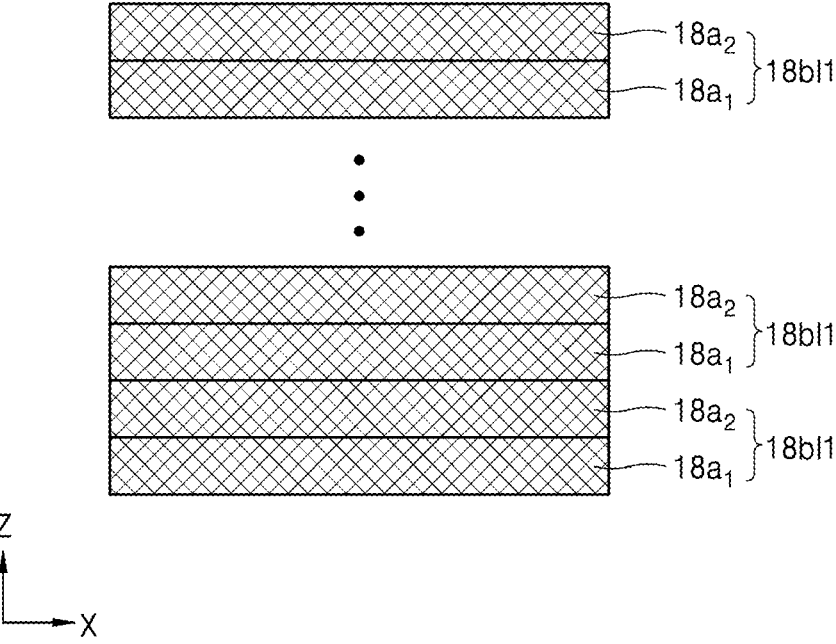
Figure 4:
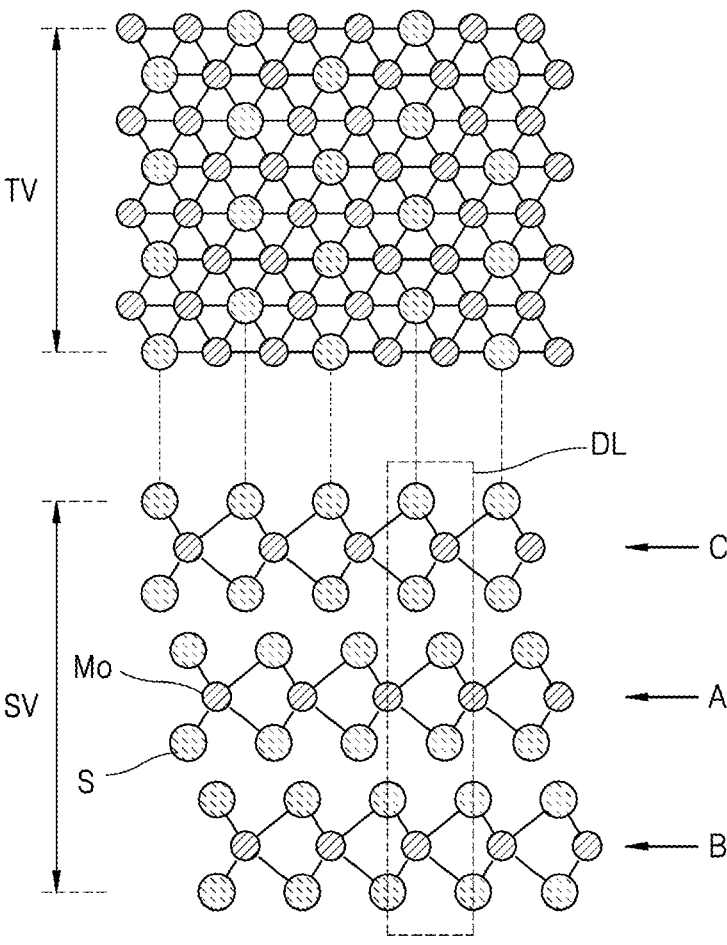
FIG. 4 is a diagram of a crystal structure of the ferroelectric material of FIGS. 2A and 2B.

FIGS. 3A and 3B are diagrams for describing a configuration of a ferroelectric material of FIGS. 2A and 2B, and FIG. 4 is a diagram for describing a crystal structure of the ferroelectric material of FIGS. 2A and 2B.

In detail, the ferroelectric material 18a may be configured as a 2D transition metal dichalcogenide layer. For example, as illustrated in FIG. 3A, the transition metal dichalcogenide layer may be configured with an $MX_2$ layer 18b11. The $MX_2$ layer 18b11 may include a first $MX_2$ mono layer 18a1 and a second $MX_2$ mono layer 18a2. The $MX_2$ layer 18b11 may be referred to as a unit $MX_2$ layer 18b11.

In another example, as illustrated in FIG. 3B, the transition metal dichalcogenide layer may be configured with n (where n is a natural number of 2 or more) number of $MX_2$ layers 18b11. That is, as illustrated in FIG. 3B, a transition metal dichalcogenide layer (18a of FIGS. 2A and 2B) may be configured by stacking n number of layers 18b11, i.e., n number of unit $MX_2$ layers 18b11 on top of each other.

Herein, a crystal structure of the transition metal dichalcogenide layer 18a is described with reference to FIG. 4.

In detail, as illustrated in FIG. 4, a 2D transition metal dichalcogenide layer configuring the ferroelectric layer 18a (FIGS. 2A and 2B) may have a 3R-type rhombohedral crystal structure. The 2D transition metal dichalcogenide layer may include an MX$_2$ layer. For example, the MX$_2$ layer may be MoS$_2$.

In FIG. 4, SV and TV represent a side view and a top view of crystals configuring the 2D transition metal dichalcogenide layer, respectively. As illustrated in FIG. 4, an interlayer atom array of the 2D transition metal dichalcogenide layer may be set with respect to an Mo atom. A first-layer atom array may be a B type, a second-layer atom array may be an A type, and a third-layer atom array may be a C type. The interlayer atom array of the 2D transition metal dichalcogenide layer may be a BAC type. In some embodiments, the interlayer atom array of the 2D transition metal dichalcogenide layer may be a BCA type.

In the 2D transition metal dichalcogenide layer, as illustrated by a reference numeral DL, it may be seen that a center line of an Mo atom does not match, e.g., align, in a stack direction (i.e., the vertical direction). Accordingly, the 2D transition metal dichalcogenide layer may have a 3R-type rhombohedral crystal structure.

Figure 5:
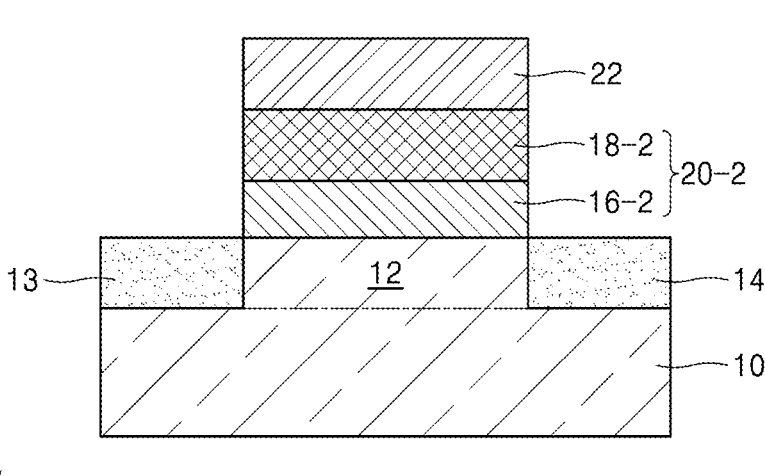
FIG. 5 is a cross-sectional view of a ferroelectric memory device according to an embodiment.

FIG. 5 is a cross-sectional view illustrating a ferroelectric memory device FETR2 according to an embodiment.

In detail, except for a configuration of a gate insulation layer 20-2, the ferroelectric memory device FETR2 may be the same as the ferroelectric memory device FETR1 of FIG. 1. In FIG. 5, descriptions which are the same as or similar to the descriptions of FIG. 1 will be briefly given below or are omitted.

Referring to FIG. 5, the ferroelectric memory device FETR2 may include the semiconductor substrate 10 with the channel layer 12, the source 13, and the drain 14. In FIG. 5, the X direction may be a direction parallel with the semiconductor substrate 10, and the Z direction may be a direction vertical to the semiconductor substrate 10. The ferroelectric memory device FETR2 may be referred to as a ferroelectric field effect transistor.

The ferroelectric memory device FETR2 may include the gate insulation layer 20-2 and the gate electrode layer 22. The gate insulation layer 20-2 may be a gate dielectric layer. The gate insulation layer 20-2 may be formed on the channel layer 12. The gate insulation layer 20-2 may include an insulation material having a hysteresis characteristic. The gate insulation layer 20-2 may include a ferroelectric inductive layer 16-2 and a ferroelectric stack structure 18-2. A structure of the gate insulation layer 20-2 will be described below in detail.

Figure 6:
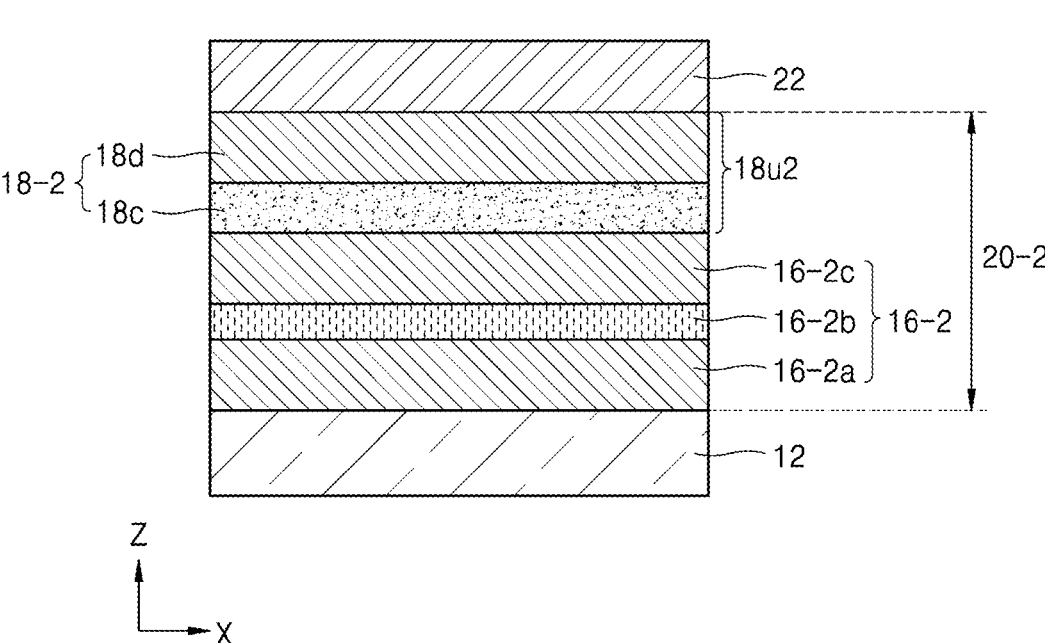
FIG. 6 is a cross-sectional view of a gate insulation layer of FIG. 5.

FIG. 6 is a cross-sectional view for describing a configuration of the gate insulation layer 20-2 of FIG. 5.

In detail, as illustrated in FIG. 6, the gate insulation layer 20-2 may include the ferroelectric inductive layer 16-2 and the ferroelectric stack structure 18-2. The gate insulation layer 20-2 may have a hysteresis characteristic, based on the application of an electric field. A polarization direction of the gate insulation layer 20-2 may be switched based on the application of an electric field. The ferroelectric inductive layer 16-2 may include a first ferroelectric inductive layer 16-2a, an oxygen-reactive layer 16-2b, and a second ferroelectric inductive layer 16-2c, which are sequentially stacked.

The first ferroelectric inductive layer 16-2a and the second ferroelectric inductive layer 16-2c may include, e.g., hafnium oxide, zirconium oxide, hafnium zirconium oxide, or a combination material thereof. The oxygen-reactive layer 16-2b may include a material layer (e.g., silicon oxide) capable of reacting, e.g., reactive, with oxygen.

The ferroelectric inductive layer 16-2 may include the oxygen-reactive layer 16-2b which is capable of reacting with oxygen in a process of manufacturing the ferroelectric memory device FETR2. Accordingly, oxide may not penetrate into an interface between the channel layer 12 and the ferroelectric inductive layer 16-2 (i.e., the first ferroelectric inductive layer 16-2a) in the process of manufacturing the ferroelectric memory device FETR2. In other words, in the gate insulation layer 20-2 of the ferroelectric memory device FETR2, the oxygen-reactive layer 16-2b may be included in the ferroelectric inductive layer 16-2, so oxide may not be provided in an interface between the channel layer 12 and the first ferroelectric inductive layer 16-2a. Therefore, the ferroelectric memory device FETR2 may increase endurance and a memory window.

The ferroelectric stack structure 18-2 may include a non-ferroelectric layer 18c and a ferroelectric layer 18d. The ferroelectric layer 18d may have a thickness which is greater than that of the non-ferroelectric layer 18c. The non-ferroelectric layer 18c and the ferroelectric layer 18d may have a thickness of several nm to tens nm. The non-ferroelectric layer 18c may include a paraelectric material. The non-ferroelectric layer 18c may include, e.g., silicon oxide, silicon nitride, or aluminum oxide.

The ferroelectric layer 18d may include, e.g., hafnium oxide, zirconium oxide, hafnium zirconium oxide, or a combination material thereof. The ferroelectric layer 18d may have an orthorhombic crystal structure. The ferroelectric layer 18d may include the same material as that of each of the first ferroelectric inductive layer 16-2a and the second ferroelectric inductive layer 16-2c.

The ferroelectric stack structure 18-2, as illustrated in FIG. 6, may include a unit ferroelectric stack structure 18u2 stacked in the order of the non-ferroelectric layer 18c and the ferroelectric layer 18d. The unit ferroelectric stack structure 18u2, unlike FIG. 6, may be stacked in plurality. Particularly, the gate insulation layer 20-2 may include a plurality of unit ferroelectric stack structures 18u2 which are provided, e.g., directly, on the ferroelectric inductive layer 16-2, and include the non-ferroelectric layer 18c and the ferroelectric layer 18d. Accordingly, the ferroelectric memory device FETR2 may enhance remanent polarization and may increase a memory window.

Figure 7:
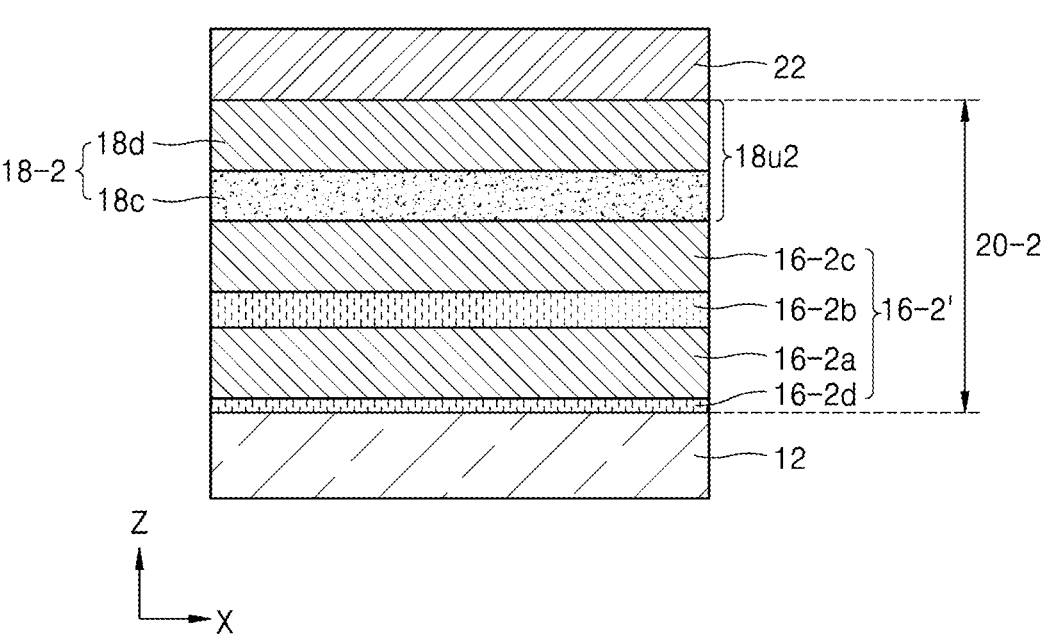
FIG. 7 is a cross-sectional view of a ferroelectric memory device according to an embodiment.

FIG. 7 is a cross-sectional view illustrating a ferroelectric memory device FETR2' according to an embodiment.

In detail, except for a configuration of a gate insulation layer 20-2', the ferroelectric memory device FETR2' may be the same as the ferroelectric memory device FETR2 of FIGS. 5 and 6. In FIG. 7, descriptions which are the same as or similar to the descriptions of FIGS. 5 and 6 will be briefly given below or are omitted.

As illustrated in FIG. 7, the gate insulation layer 20-2' may include a ferroelectric inductive layer 16-2' and the ferroelectric stack structure 18-2. The ferroelectric inductive layer 16-2' may include the first ferroelectric inductive layer 16-2a, the oxygen-reactive layer 16-2b, the second ferroelectric inductive layer 16-2c, and an interface layer 16-2d.

The interface layer 16-2d may be formed between the channel layer 12 and the first ferroelectric inductive layer 16-2a. The interface layer 16-2d may have a thickness which is thinner than a thickness of the first ferroelectric inductive layer 16-2a, e.g., in the Z direction. For example, the interface layer 16-2d may have a thin thickness of 0.5 nm or less. In the gate insulation layer 20-2' of the ferroelectric memory device FETR2', the interface layer 16-2d may be included in the ferroelectric inductive layer 16-2, so penetration of oxide into an interface between the channel layer 12 and the first ferroelectric inductive layer 16-2a may be reduced.

In general, oxide may potentially partially penetrate into an interface between a channel layer and an adjacent ferroelectric inductive layer in a process of manufacturing a ferroelectric memory device. Therefore, the interface layer 16-2d may be formed between the channel layer 12 and the first ferroelectric inductive layer 16-2a to minimize oxide penetration therebetween. Because a thickness of the interface layer 16-2d is very thin (e.g., thinner than the first ferroelectric inductive layer 16-2a), the ferroelectric memory device FETR2' may enhance endurance and a memory window at an appropriate level.

Further, the gate insulation layer 20-2' of the ferroelectric memory device FETR2' may include a plurality of unit ferroelectric stack structures 18u2 which are provided on the ferroelectric inductive layer 16-2 and include the non-ferroelectric layer 18c and the ferroelectric layer 18d. Accordingly, the ferroelectric memory device FETR2' may enhance remanent polarization and may increase a memory window.

FIGS. 8 to 11 are cross-sectional views of stages in a method of manufacturing the ferroelectric memory device FETR2 of FIGS. 5 and 6. In detail, FIGS. 8 to 11 are diagrams of stages in a method of manufacturing the gate insulation layer 20-2 of the ferroelectric memory device FETR2 of FIGS. 5 and 6.

Figure 8:
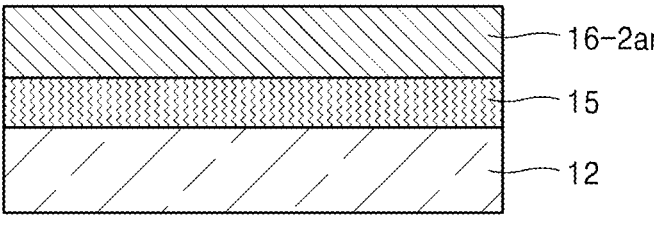
FIGS. 8 to 11 are cross-sectional views of stages in a method of manufacturing the ferroelectric memory device of FIGS. 5 and 6.
Figure 8:
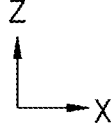

Referring to FIG. 8, an interface material layer 15 and a first ferroelectric inductive material layer 16-2ar may be formed on the channel layer 12. The interface material layer 15 and the first ferroelectric inductive material layer 16-2ar may be formed by a same, e.g., simultaneous, process or by subsequent processes.

The first ferroelectric inductive material layer 16-2ar may be formed in an amorphous state. The first ferroelectric inductive material layer 16-2ar may include, e.g., hafnium oxide, zirconium oxide, hafnium zirconium oxide, or a combination material thereof. The first ferroelectric inductive material layer 16-2ar may be formed by, e.g., a chemical vapor deposition (CVD) process, a sputtering process, or an atomic layer deposition (ALD) process.

The interface material layer 15 may be formed by a process of forming the first ferroelectric inductive material layer 16-2ar or a process subsequent thereto. When the channel layer 12 includes silicon, the interface material layer 15 may include a silicon oxide layer. The silicon oxide layer may be an oxygen-rich material layer.

Figure 9:
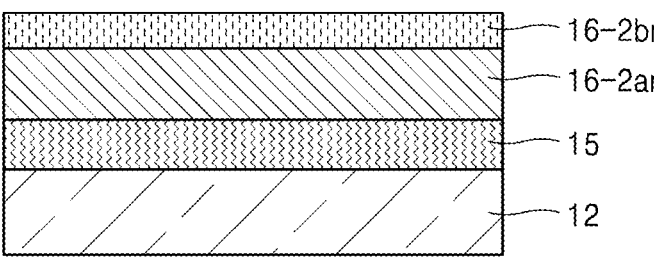
Figure 9:
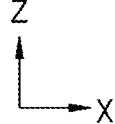

Referring to FIG. 9, an oxygen reaction material layer 16-2br may be formed on the first ferroelectric inductive material layer 16-2ar. The oxygen reaction material layer 16-2br may include a silicon layer.

The oxygen reaction material layer 16-2br may be a material layer where oxygen of the interface material layer 15 reacts with oxygen in diffusing via the first ferroelectric inductive material layer 16-2ar in a post process. The silicon layer configuring the oxygen reaction material layer 16-2br may be an oxygen-deficient material layer. The oxygen reaction material layer 16-2br may be formed by, e.g., a CVD process, a sputtering process, or an ALD process.

Figure 10:
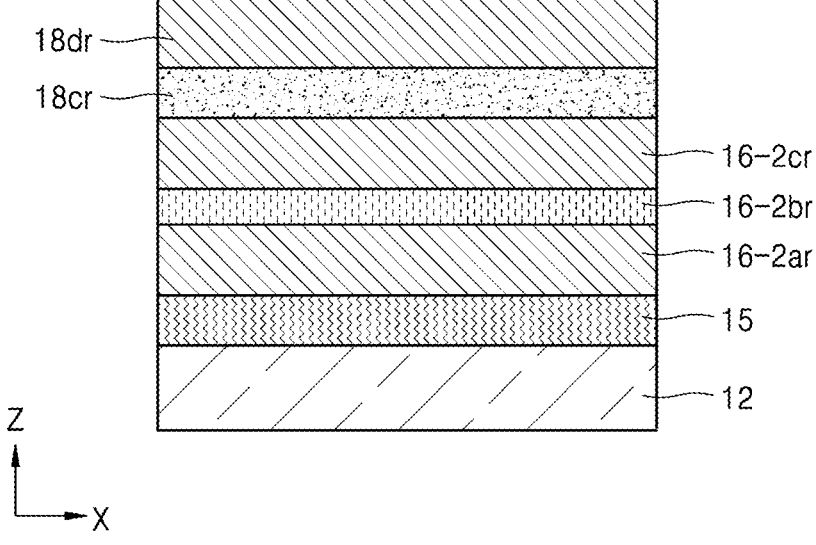

Referring to FIG. 10, a second ferroelectric inductive material layer 16-2cr may be formed on the oxygen reaction material layer 16-2br. The second ferroelectric inductive material layer 16-2cr may be formed in an amorphous state. The second ferroelectric inductive material layer 16-2cr may include the same material as that of the first ferroelectric inductive material layer 16-2ar. The second ferroelectric inductive material layer 16-2cr may include, e.g., hafnium oxide, zirconium oxide, hafnium zirconium oxide, or a combination material thereof. The second ferroelectric inductive material layer 16-2cr may be formed by, e.g., a CVD process, a sputtering process, or an ALD process.

A non-ferroelectric material layer 18cr and a ferroelectric material layer 18dr may be sequentially formed on the second ferroelectric inductive material layer 16-2cr. The non-ferroelectric material layer 18cr may include a paraelectric material. The non-ferroelectric material layer 18cr may include, e.g., silicon oxide, silicon nitride, or aluminum oxide.

The ferroelectric material layer 18dr may be formed in an amorphous state. The ferroelectric material layer 18dr may include, e.g., hafnium oxide, zirconium oxide, hafnium zirconium oxide, or a combination material thereof. The ferroelectric material layer 18dr may include the same material as that of each of the first ferroelectric inductive material layer 16-2ar and the second ferroelectric inductive material layer 16-2cr. The non-ferroelectric material layer 18cr and the ferroelectric material layer 18dr may be formed by, e.g., a CVD process, a sputtering process, or an ALD process.

Figure 11:
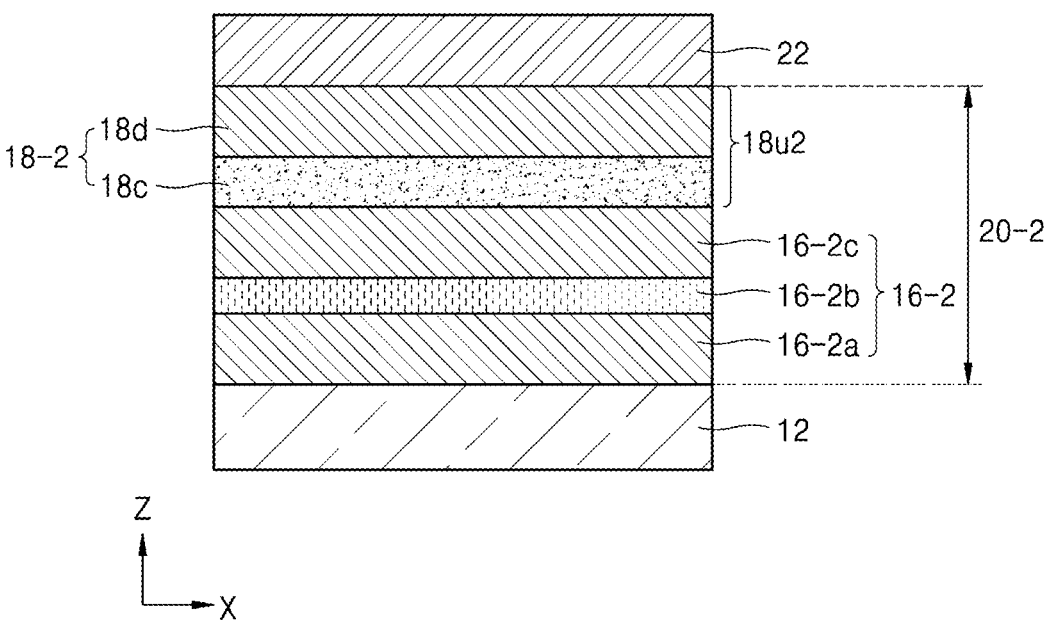

Referring to FIG. 11, an annealing process may be performed by using the resultant material (structure) of FIG. 10. A first ferroelectric inductive material layer (16-2ar of FIG. 10), a second ferroelectric inductive material layer (16-2cr of FIG. 10), and a ferroelectric material layer (18dr of FIG. 10) may be crystallized through the annealing process, and thus, may have ferroelectricity. The annealing process may be performed at a process temperature of 500° C. or 1,000° C.

Based on the annealing process, the first ferroelectric inductive material layer (16-2ar of FIG. 10) and the second ferroelectric inductive material layer (16-2cr of FIG. 10) may respectively be the first ferroelectric inductive layer 16-2a and the second ferroelectric inductive layer 16-2c. Based on the annealing process, oxygen of an interface material layer (15 of FIG. 10) may react with an oxygen reaction material layer (16-2br of FIG. 10) in diffusing via the first ferroelectric inductive material layer (16-2ar of FIG. 10).

Therefore, as illustrated in FIG. 11, the interface material layer (15 of FIG. 10) may be consumed and removed, and the oxygen reaction material layer 16-2br may be the oxygen-reactive layer 16-2b. The oxygen-reactive layer 16-2b may include silicon oxide. As a result, the ferroelectric inductive layer 16-2 where the first ferroelectric inductive layer 16-2a, the oxygen-reactive layer 16-2b, and the second ferroelectric inductive layer 16-2c are sequentially stacked may be formed on the channel layer 12.

Based on the annealing process, the non-ferroelectric material layer 18cr and the ferroelectric material layer 18dr may respectively be the non-ferroelectric layer 18c and the ferroelectric layer 18d. Based on the annealing process, the ferroelectric material layer 18dr may be crystallized, and thus, may be the ferroelectric layer 18d. The ferroelectric layer 18d may have an orthorhombic crystal structure. The non-ferroelectric layer 18c and the ferroelectric layer 18d may be configured as the ferroelectric stack structure 18-2. The non-ferroelectric layer 18c and the ferroelectric layer 18d may be configured as the unit ferroelectric stack structure 18u2.

Only one unit ferroelectric stack structure 18u2 is illustrated in FIG. 11, but unlike FIG. 11, a plurality of unit ferroelectric stack structures 18u2 may be provided. In a case where a plurality of unit ferroelectric stack structures 18u2 are provided, a non-ferroelectric material layer (18cr of FIG. 10) and a ferroelectric material layer (18dr of FIG.

10) may be obtained through a plurality of deposition processes and a plurality of annealing processes.

The gate insulation layer 20-2 may be formed on the channel layer 12 by the processes described above. The gate insulation layer 20-2 may include the ferroelectric inductive layer 16-2 and the ferroelectric stack structure 18-2. Subsequently, the gate electrode layer 22 may be formed on the gate insulation layer 20-2. The gate electrode layer 22 may include a metal material or conductive metal nitride. The gate electrode layer 22 may include, e.g., tungsten, aluminum, copper, titanium, tantalum, titanium nitride, tantalum nitride, tungsten nitride, tungsten carbide nitride, or a combination thereof.

Figure 12:
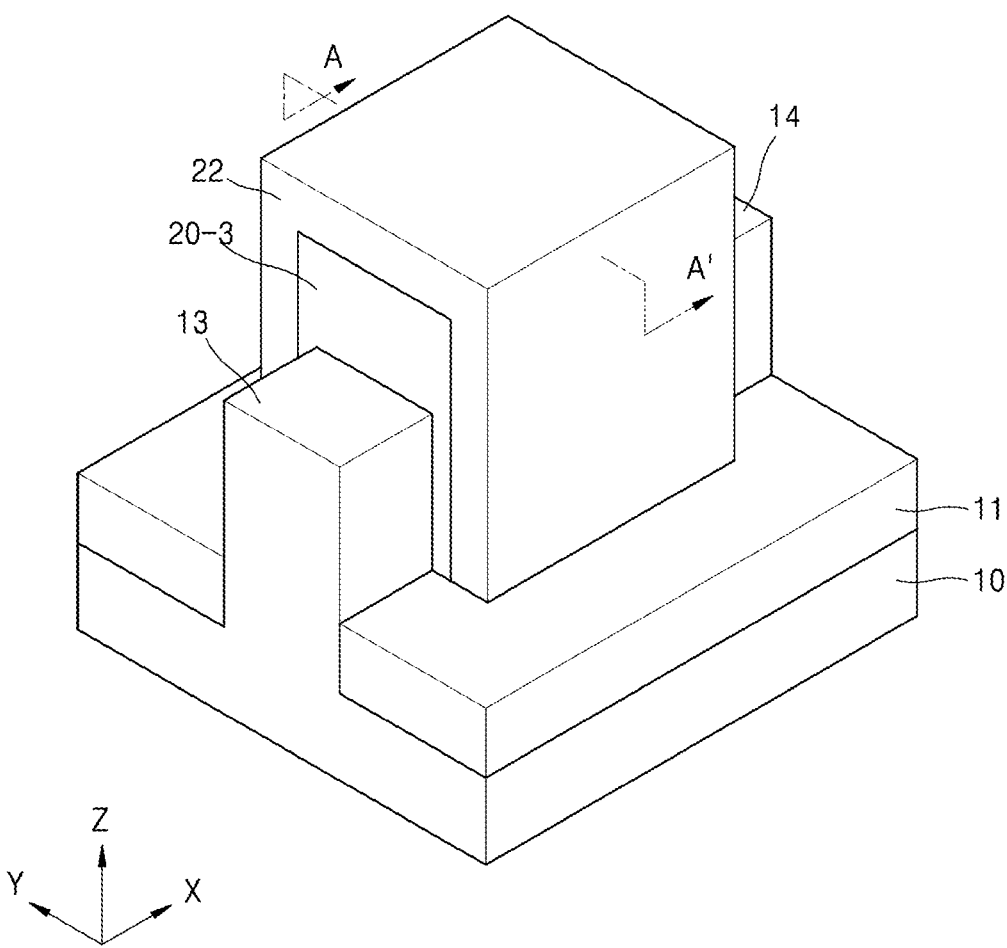
FIGS. 12 and 13 are diagrams illustrating a ferroelectric memory device according to an embodiment.
Figure 13:
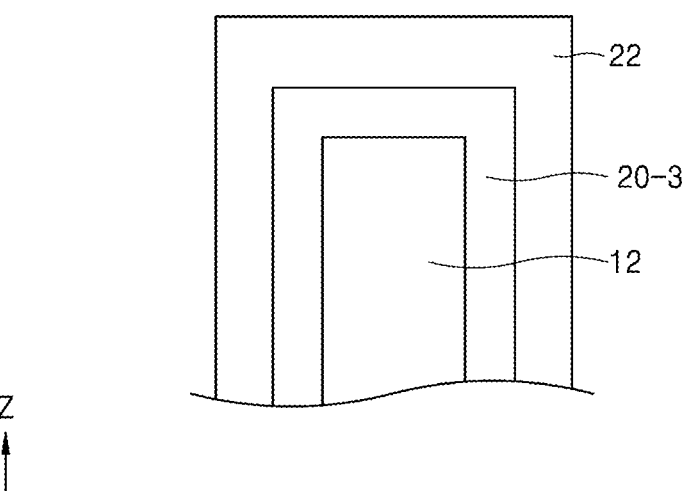

FIGS. 12 and 13 are diagrams illustrating a ferroelectric memory device FETR3 according to an embodiment.

In detail, the ferroelectric memory device FETR3 of FIG. 12 is illustrated by a perspective view of a fin ferroelectric field effect transistor, and FIG. 13 is a cross-sectional view taken along line A-A' of FIG. 12. The ferroelectric memory device FETR3 may include the source 13, the drain 14, and the channel layer 12 defined as a region between the source 13 and the drain 14.

The channel layer 12 may have a fin type which protrudes from the semiconductor substrate 10. In FIGS. 12 and 13, the X direction and the Y direction may each be a direction parallel with the semiconductor substrate 10, and the Z direction may be a direction vertical to the semiconductor substrate 10. The gate electrode layer 22 may be disposed to intersect with the channel layer 12 of a fin type. The source 13, the drain 14, and the channel layer 12 may be insulated from one another by a device isolation layer 11.

A gate insulation layer 20-3 and the gate electrode layer 22 may be sequentially formed on the channel layer 12. The gate insulation layer 20-3 may be disposed between the channel layer 12 and the gate electrode layer 22.

In some embodiments, the gate insulation layer 20-3 may include one of the gate insulation layers 20-1 and 20-2 illustrated in FIGS. 1 and 5. The gate insulation layer 20-3 may include one of the ferroelectric inductive layers 16-1 and 16-2 and the ferroelectric stack structures 18-1 and 18-2, each illustrated in FIGS. 1 and 5. The gate insulation layer 20-3 has been described above, and thus, a repetitive description thereof is omitted.

FIGS. 14 to 17 are diagrams illustrating a ferroelectric memory device FETR4 according to an embodiment.

Figure 14:
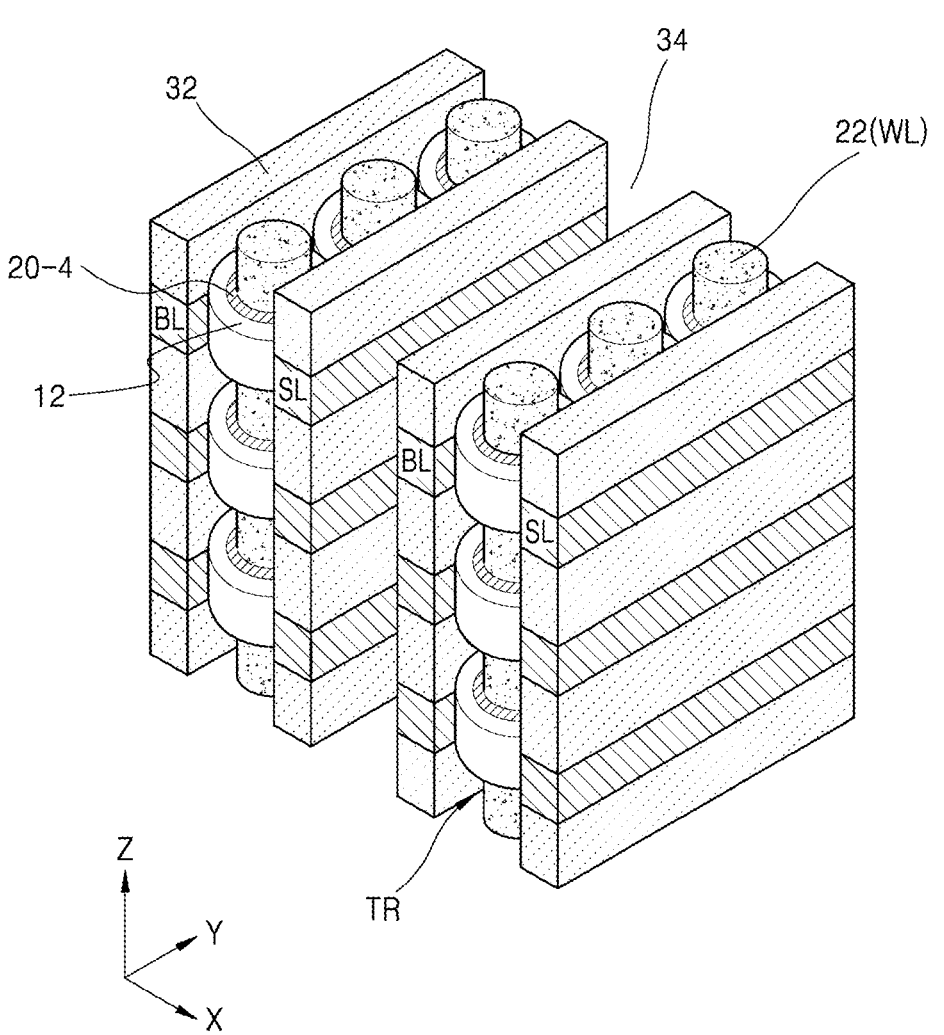
FIGS. 14 to 17 are diagrams illustrating a ferroelectric memory device according to an embodiment.
Figure 15:
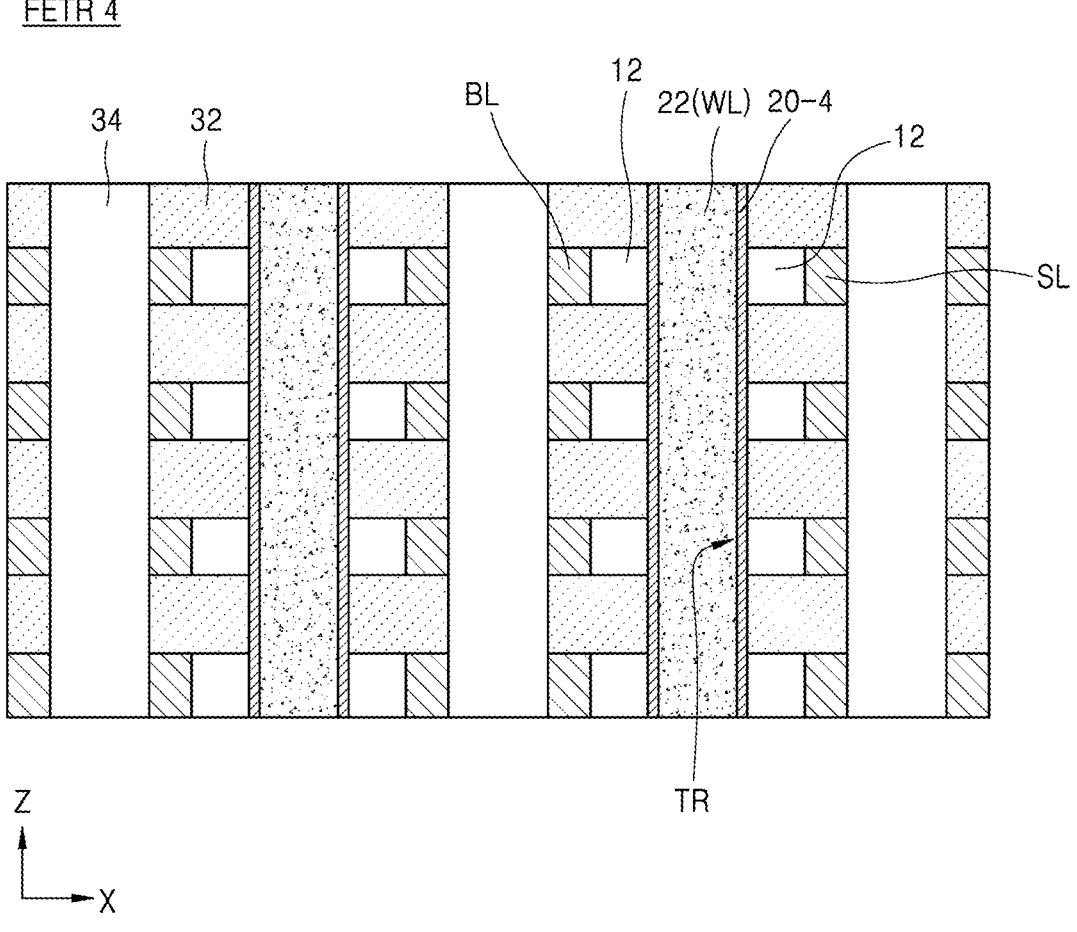
Figure 16:
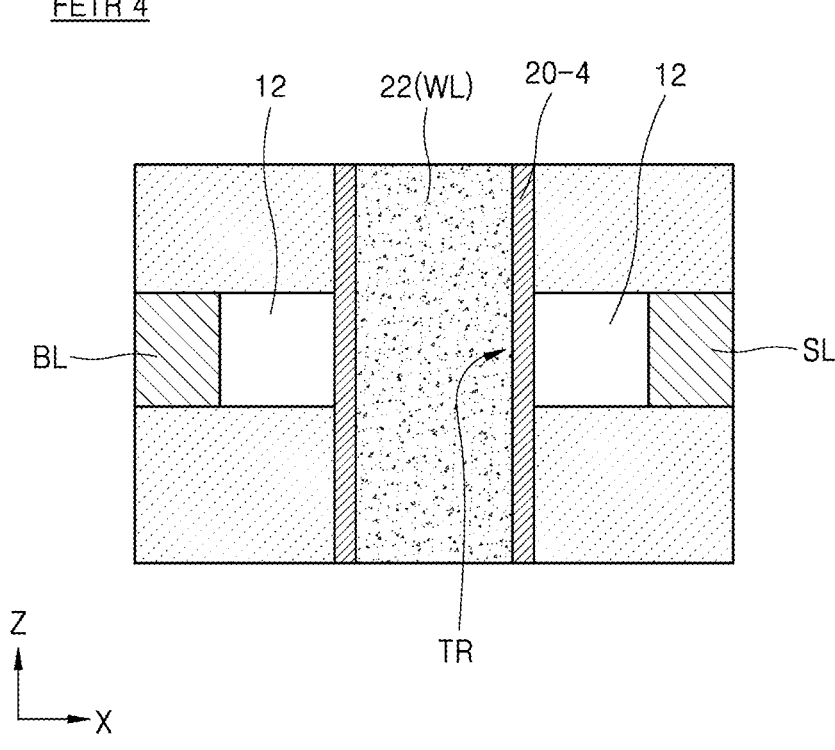
Figure 17:
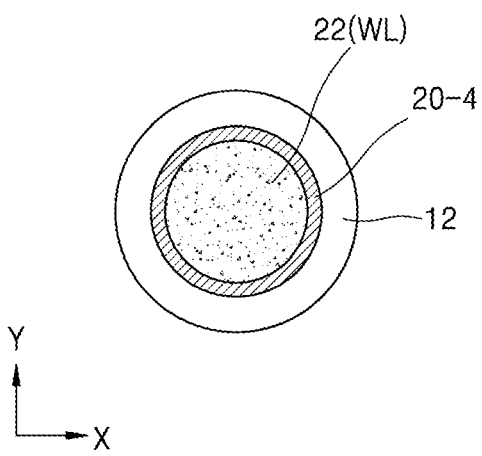

In detail, a ferroelectric memory device FETR4 of FIG. 14 is illustrated by a perspective view. FIG. 15 is a cross-sectional view in the X direction and the Y direction of FIG. 14. FIG. 16 is a partial enlarged view of FIG. 15, and FIG. 17 is a plan view in the X direction and the Y direction of FIG. 14.

The gate electrode layer 22 may be arranged in a direction (the Z direction) vertical to the semiconductor substrate (10 of FIG. 1). A plurality of gate electrode layers 22 may be spaced apart from one another in the Y direction. The gate electrode layer 22 may be a word line WL. The word line WL may be a third conductive line (a third conductive terminal).

A gate insulation layer 20-4 may be formed at a perimeter of the gate electrode layer 22, e.g., the gate insulation layer 20-4 may surround an entire perimeter of the gate electrode layer 22 (top view). The gate insulation layer 20-4 may be disposed at both sides of the gate electrode layer 22 in the cross-sectional views of FIGS. 15 and 16.

The gate insulation layer 20-4 may include one of the gate insulation layers 20-1 and 20-2 illustrated in FIGS. 1 and 5. The gate insulation layer 20-3 may include one of the ferroelectric inductive layers 16-1 and 16-2 and the ferroelectric stack structures 18-1 and 18-2, each illustrated in FIGS. 1 and 5. The gate insulation layer 20-3 has been described above, and thus, a repetitive description thereof is omitted. The channel layer 12 may be disposed to surround the gate insulation layer 20-4. The channel layer 12 may be disposed at one side and the other side of the gate insulation layer 20-4 in the cross-sectional views of FIGS. 15 and 16.

A source line SL extending in the Y direction parallel with the semiconductor substrate (10 of FIG. 1) may be disposed at one side of the channel layer 12. A plurality of source lines SL may be spaced apart from one another by an interlayer insulation layer 32 in the Z direction. A bit line BL (or a drain line) extending in the Y direction parallel with the semiconductor substrate (10 of FIG. 1) may be disposed at the other side of the channel layer 12.

A plurality of bit lines BL may be spaced apart from one another by the interlayer insulation layer 32 in the Z direction. A buried insulation layer 34 may be formed between the source line SL and the bit line BL in the X direction. The source line SL may be a second conductive line. The bit line BL may be a third conductive line.

The ferroelectric memory device FETR4 may include one gate electrode layer 22 in the Z direction vertical to the semiconductor substrate (10 of FIG. 1), and for example, may include a plurality of ferroelectric transistors TR along the word line WL. Each of the plurality of ferroelectric transistors TR may include the channel layer 12, the gate insulation layer 20-4, the gate electrode layer 22, the source line SL, and the bit line BL. In the ferroelectric memory device FETR4, the plurality of ferroelectric transistors TR may be serially connected to one another in the Z direction.

By way of summation and review, embodiments provide a ferroelectric memory device which may enhance remanent polarization and may increase a memory window and endurance. That is, according to embodiments, a ferroelectric memory device may include a ferroelectric stack structure where a ferroelectric material and a non-ferroelectric material are stacked, thereby enhancing remanent polarization and a memory window. Further, a very thin interface layer between a channel layer and a ferroelectric inductive layer may be provided to further enhance endurance and a memory window at an appropriate level.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A ferroelectric memory device, comprising:
a channel layer;
a gate insulation layer on the channel layer; and
a gate electrode layer on the gate insulation layer, the gate insulation layer including:
a ferroelectric inductive layer, and a ferroelectric stack structure on the ferroelectric inductive layer, the ferroelectric stack structure including a stack of a ferroelectric layer and a non-ferroelectric layer:

wherein at least one of the ferroelectric inductive layer, the ferroelectric layer or the non-ferroelectric layer includes a two-dimensional material.

2. The ferroelectric memory device as claimed in claim 1, wherein the ferroelectric layer includes a two-dimensional transition metal dichalcogenide layer.

3. The ferroelectric memory device as claimed in claim 2, wherein the two-dimensional transition metal dichalcogenide layer includes an $MX_2$ layer having a 3R-type rhombohedral crystal structure, M including one or more of molybdenum (Mo), tungsten (W), and zirconium (Zr), and X including one or more of sulfur(S), selenium (Se), and tellurium (Te).

4. The ferroelectric memory device as claimed in claim 3, wherein the non-ferroelectric layer includes a nitride having a hexagonal crystal structure, as a two-dimensional material.

5. The ferroelectric memory device as claimed in claim 2, wherein the ferroelectric layer includes a nitride having a hexagonal crystal structure, as a two-dimensional material.

6. The ferroelectric memory device as claimed in claim 1, wherein the ferroelectric stack structure includes a plurality of ferroelectric stack structure units, each of the plurality of ferroelectric stack structure units including the stack of the ferroelectric layer and the non-ferroelectric layer.

7. The ferroelectric memory device as claimed in claim 1, wherein the ferroelectric layer includes hafnium oxide, zirconium oxide, hafnium zirconium oxide, or a combination thereof.

8. The ferroelectric memory device as claimed in claim 7, wherein the ferroelectric inductive layer includes a first ferroelectric inductive layer, an oxygen-reactive layer, and a second ferroelectric inductive layer, which are sequentially stacked.

9. The ferroelectric memory device as claimed in claim 8, wherein each of the first ferroelectric inductive layer and the second ferroelectric inductive layer includes hafnium oxide, zirconium oxide, hafnium zirconium oxide, or a combination thereof.

10. The ferroelectric memory device as claimed in claim 8, wherein the oxygen-reactive layer includes a silicon oxide, the silicon oxide being reactive with oxygen.

11. The ferroelectric memory device as claimed in claim 8, further comprising an interface layer between the channel layer and the first ferroelectric inductive layer.

12. A ferroelectric memory device, comprising:
a channel layer;
a gate insulation layer on the channel layer; and
a gate electrode layer on the gate insulation layer, the gate insulation layer including:
a ferroelectric inductive layer, and
a ferroelectric stack structure on the ferroelectric inductive layer, the ferroelectric stack structure having a stack of a ferroelectric layer and a non-ferroelectric layer and including a two-dimensional transition metal dichalcogenide layer.

13. The ferroelectric memory device as claimed in claim 12, wherein the two-dimensional transition metal dichalcogenide layer includes an $MX_2$ layer having a 3R-type rhombohedral crystal structure, M including one or more of molybdenum (Mo), tungsten (W), and zirconium (Zr), and X including one or more of sulfur(S), selenium (Se), and tellurium (Te).

14. The ferroelectric memory device as claimed in claim 13, wherein the non-ferroelectric layer includes a nitride having a hexagonal crystal structure, as a two-dimensional material.

15. The ferroelectric memory device as claimed in claim 12, wherein the ferroelectric inductive layer includes a nitride having a hexagonal crystal structure.

16. The ferroelectric memory device as claimed in claim 12, wherein the ferroelectric stack structure includes a plurality of ferroelectric stack structure units, each of the plurality of ferroelectric stack structure units including the stack of the ferroelectric layer and the non-ferroelectric layer.

17. A ferroelectric memory device, comprising:
a channel layer;
a gate insulation layer on the channel layer; and
a gate electrode layer on the gate insulation layer, the gate insulation layer including:
a ferroelectric inductive layer, and
a ferroelectric stack structure on the ferroelectric inductive layer, the ferroelectric stack structure including a stack of a non-ferroelectric layer and a ferroelectric layer,
wherein the ferroelectric inductive layer includes a first ferroelectric inductive layer, an oxygen-reactive layer, and a second ferroelectric inductive layer, which are sequentially stacked.

18. The ferroelectric memory device as claimed in claim 17, wherein the ferroelectric layer includes hafnium oxide, zirconium oxide, hafnium zirconium oxide, or a combination thereof.

19. The ferroelectric memory device as claimed in claim 17, wherein:
each of the first ferroelectric inductive layer and the second ferroelectric inductive layer includes hafnium oxide, zirconium oxide, hafnium zirconium oxide, or a combination thereof, and
the oxygen-reactive layer includes silicon oxide capable of reacting with oxygen.

20. The ferroelectric memory device as claimed in claim 17, wherein the ferroelectric stack structure includes a plurality of ferroelectric stack structure units, each of the plurality of ferroelectric stack structure units including the stack of the ferroelectric layer and the non-ferroelectric layer.

* * * * *